United States Patent
Chang et al.

(10) Patent No.: US 8,803,129 B2
(45) Date of Patent: Aug. 12, 2014

(54) PATTERNING CONTACTS IN CARBON NANOTUBE DEVICES

(75) Inventors: Josephine B Chang, Mahopac, NY (US); Martin Glodde, Mahwah, NJ (US); Michael A. Guillorn, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/270,648

(22) Filed: Oct. 11, 2011

(65) Prior Publication Data

US 2013/0087767 A1    Apr. 11, 2013

(51) Int. Cl.
| | | |
|---|---|---|
| H01L 29/06 | (2006.01) | |
| H01L 31/00 | (2006.01) | |
| H01L 29/76 | (2006.01) | |
| H01L 21/02 | (2006.01) | |
| H01L 21/84 | (2006.01) | |
| H01L 21/336 | (2006.01) | |
| H01L 51/00 | (2006.01) | |
| H01L 29/775 | (2006.01) | |
| H01L 29/423 | (2006.01) | |

(52) U.S. Cl.
CPC ........ *H01L 51/0048* (2013.01); *H01L 29/0673* (2013.01); *H01L 29/775* (2013.01); *H01L 29/42384* (2013.01); *H01L 29/42392* (2013.01); *Y10S 977/742* (2013.01); *Y10S 977/938* (2013.01)
USPC ........ 257/24; 257/288; 257/346; 257/E51.04; 257/E29.245; 257/E21.404; 977/742; 977/938; 438/151; 438/299

(58) Field of Classification Search
CPC ............ H01L 51/0048; H01L 29/0673; H01L 29/775; H01L 29/42384; H01L 29/42392
USPC ........... 257/24, E21.404, E21.408, 288, 346, 257/E51.04, E29.245, E29.255; 977/742, 977/938; 438/151, 299, 197
See application file for complete search history.

(56) References Cited

U.S. PATENT DOCUMENTS

| | | | |
|---|---|---|---|
| 6,100,954 A | 8/2000 | Kim et al. | |
| 6,424,039 B2 | 7/2002 | Wang et al. | |

(Continued)

FOREIGN PATENT DOCUMENTS

JP    2006245127 A    9/2006

OTHER PUBLICATIONS

Han et al., "Wafer Scale Fabrication of Carbon Nanotube FETs with Embedded Poly-Gates", IEEE International Electron Device Meeting 2010, Dec. 6-8, 2010, pp. 206-209.

(Continued)

*Primary Examiner* — Fernando L Toledo
*Assistant Examiner* — Aaron Gray
(74) *Attorney, Agent, or Firm* — Harrington & Smith

(57) ABSTRACT

A structure includes a substrate having a carbon nanotube (CNT) disposed over a surface. The CNT is partially disposed within a protective electrically insulating layer. The structure further includes a gate stack disposed over the substrate. A first portion of a length of the CNT not covered by the protective electrically insulating layer passes through the gate stack. Source and drain contacts are disposed adjacent to the gate stack, where second and third portions of the length of CNT not covered by the protective electrically insulating layer are conductively electrically coupled to the source and drain contacts. The gate stack and the source and drain contacts are contained within the protective electrically insulating layer and within an electrically insulating organic planarization layer that is disposed over the protective electrically insulating layer. A method to fabricate a CNT-based transistor is also described.

16 Claims, 8 Drawing Sheets

(56) References Cited

U.S. PATENT DOCUMENTS

| | | |
|---|---|---|
| 7,598,111 B2 | 10/2009 | Im et al. |
| 7,700,459 B2 | 4/2010 | Kameyama et al. |
| 7,786,466 B2 * | 8/2010 | Appenzeller et al. ........... 257/14 |
| 7,803,709 B2 | 9/2010 | Yune et al. |
| 7,892,945 B2 | 2/2011 | Bedell et al. |
| 2003/0085404 A1 * | 5/2003 | Kim et al. ....................... 257/72 |
| 2003/0178617 A1 * | 9/2003 | Appenzeller et al. ........... 257/20 |
| 2007/0155064 A1 | 7/2007 | Chen et al. |
| 2008/0014675 A1 * | 1/2008 | Kameyama et al. ............. 438/82 |
| 2008/0026554 A1 | 1/2008 | Yang |
| 2008/0145648 A1 | 6/2008 | Haas et al. |
| 2008/0173864 A1 | 7/2008 | Fujita et al. |
| 2008/0230853 A1 | 9/2008 | Jang et al. |
| 2009/0061568 A1 | 3/2009 | Bangsaruntip et al. |
| 2009/0079890 A1 * | 3/2009 | Tanabe et al. ................... 349/43 |
| 2009/0267053 A1 * | 10/2009 | Peng et al. ....................... 257/24 |
| 2009/0311634 A1 | 12/2009 | Yue et al. |
| 2011/0039413 A1 | 2/2011 | Akinmade-Yusuff et al. |
| 2011/0062419 A1 * | 3/2011 | Kikuchi et al. .................. 257/24 |
| 2011/0127492 A1 | 6/2011 | Chang et al. |
| 2011/0127493 A1 | 6/2011 | Cabral, Jr. et al. |

OTHER PUBLICATIONS

Javey et al., "Self-Aligned Ballistic Moledular Transistors and Electrically Parallel Nanotube Arrays", Nano Letters, vol. 4, No. 7, 2004, pp. 1319-1322.

Kim et al., "Hysteresis Caused by Water Molecules in Carbon Nanotube Field-Effect Transistors", Nano Letters, vol. 3, No. 2, 2003, pp. 193-198.

Wind et al., "Carbon Nanotube Devices for Future Nanoelectronics", IEEE Conference on Nanotechnology, IEEE Nano 2003, Aug. 12-14, 2003, p. 236-239.

Javey, A. et al.; "Advancements in Complementary Carbon Nanotube Field-Effect Transistors"; International Electron Devices Meeting, 2003; pp. 741-744; IEEE.

* cited by examiner

PATTERNING CONTACTS IN CARBON NANOTUBE DEVICES

TECHNICAL FIELD

The exemplary embodiments of this invention relate generally to carbon nanotube-based electronic devices and, more specifically, relate to methods for processing carbon nanotube devices to form gate and source/drain electrical contacts in a carbon nanotube-based transistor.

BACKGROUND

As scaling for conventional CMOS integrated circuits approaches quantum mechanical limits, alternative nanostructures and materials have been investigated in the semiconductor industry. Of such nanostructures and materials, carbon nanotubes (CNTs) offer excellent intrinsic properties that are suitable for high performance nanoscale devices.

CNTs are allotropes of carbon that exhibit a cylindrical nanostructure and are members of the fullerene structural family. Their name is derived from their long, hollow structure having walls formed by one-atom-thick sheets of carbon, known as graphene.

CNTs can be used to construct electronic devices such as transistors as evidenced by, for example, commonly assigned US 2011/0127492 A1, "Field Effect Transistor Having Nanostructure Channel", Josephine B. Chang, Michael A. Guillorn and Eric A. Joseph, and commonly assigned US 2011/0127493 A1. "Self Aligned Carbide Source/Drain FET", Cyril Cabral, Jr., Josephine B. Chang, Alfred Grill, Michael A. Guillorn, Christian Lavoie and Eugene J. O'Sullivan.

SUMMARY

In accordance with a first aspect thereof the exemplary embodiments of this invention provide a structure that comprises a substrate having a carbon nanotube disposed over a surface of the substrate. The carbon nanotube is partially disposed within a protective electrically insulating layer. The structure further comprises a gate stack disposed over the substrate, where a first portion of a length of the carbon nanotube not covered by the protective electrically insulating layer passes through the gate stack and where the first portion of the length defines a channel. The structure further comprises a source contact disposed adjacent to a first side of the gate stack, where a second portion of the length of carbon nanotube not covered by the protective electrically insulating layer is conductively electrically coupled to the source contact. The structure further comprises a drain contact disposed adjacent to a second, opposite side of the gate stack, where a third portion of the length of carbon nanotube not covered by the protective electrically insulating layer is conductively electrically coupled to the drain contact. In the structure the gate stack, the source contact and the drain contact are contained within the protective electrically insulating layer and within an electrically insulating organic planarization layer that is disposed over the protective electrically insulating layer.

In accordance with a first aspect thereof the exemplary embodiments of this invention provide a method of forming a field effect transistor. The method comprises providing a substrate having a carbon nanotube disposed over a surface of the substrate; forming a protective electrically insulating layer over the carbon nanotube; and forming a first multi-layer resist stack over the protective electrically insulating layer. The first multi-layer resist stack comprises a bottom layer, an intermediate layer and a top layer of resist. The method further comprises patterning and selectively removing a portion of the first multi-layer resist stack to define an opening for a gate stack, where selectively removing also completely removes the intermediate layer and the top layer of resist leaving the bottom layer. The method further comprises selectively removing a portion of the protective electrically insulating layer within the opening to expose a first portion of the carbon nanotube; forming the gate stack within the opening and upon the exposed first portion of the carbon nanotube; forming a second multi-layered resist stack upon the bottom layer and upon the gate stack; patterning and selectively removing a portion of the second multi-layer resist stack to define an opening for a source contact and an opening for a drain contact; selectively removing a portion of the protective electrically insulating layer within the source contact opening and within the drain contact opening to expose a second portion of the carbon nanotube and a third portion of the carbon nanotube; and applying contact material within the source contact opening and within the drain contact opening and upon the exposed second and third portions of the carbon nanotube.

BRIEF DESCRIPTION OF THE SEVERAL VIEWS OF THE DRAWINGS

FIG. 1A depicts a starting structure composed of a substrate, an insulating layer and a CNT disposed on the insulating layer;

FIG. 1B shows the starting structure of FIG. 1A after the deposition of a protective layer over the CNT followed by the deposition of a tri-layer resist stack;

FIG. 1C shows the structure of FIG. 1B after patterning of the resist layer to form an opening where a gate stack will be formed;

FIG. 1D shows the structure of FIG. 1C after patterning of the OPL;

FIG. 1E shows the structure of FIG. 1D after a portion of the protective layer is removed within the opening thereby exposing a portion of the CNT that will form the channel of the fabricated transistor;

FIG. 1E' shows an alternative embodiment of the structure of FIG. 1D after the portion of the protective layer is removed within the opening thereby exposing the portion of the CNT that will form the channel of the fabricated transistor, as well as the selective removal of the underlying insulating layer for suspending the exposed portion of the CNT;

FIG. 1F shows the structure of FIG. 1E after formation of a gate stack;

FIG. 1G shows the structure of FIG. 1F after excess gate metal and gate dielectric materials are removed;

FIG. 1H shows the structure of FIG. 1G after a re-application of patterning layers including a layer of LTO or SiARC material and a layer of resist;

FIG. 1I shows the structure of FIG. 1H after a contact metal pattern is exposed in the resist layer as a shape that spans the gate stack;

FIG. 1J shows the structure of FIG. 1I after LTO or SiARC material applied in FIG. H is removed;

FIG. 1K shows the structure of FIG. 1J after the contact pattern is transferred into the OPL;

FIG. 1L shows the structure of FIG. 1K after the protective layer is removed within the contact portion, thereby again exposing the CNT; and FIG. 1M shows the structure of FIG. 1L after source (S) and drain (D) contact material is deposited and the structure is planarized.

DETAILED DESCRIPTION

The exemplary and non-limiting embodiments of this invention are described with reference to the process flow depicted in FIGS. 1A-1M, collectively referred to as FIG. 1. In general, FIG. 1 presents an enlarged cross-sectional view of a substrate 10 having various layers disposed over a major surface thereof. The various layer thicknesses are not drawn to scale.

Figure 1A:
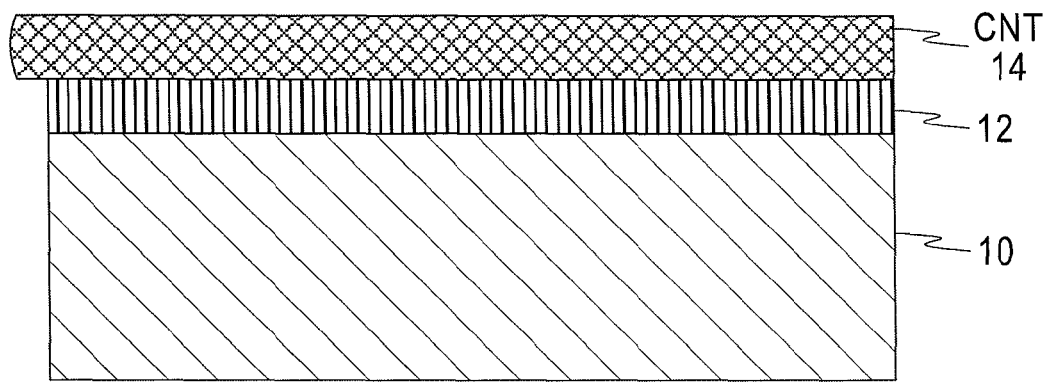
FIGS. 1A-1M, collectively referred to as FIG. 1, illustrate a process flow suitable for fabricating a transistor in accordance with embodiments of this invention, where

FIG. 1A depicts a starting structure composed of the substrate 10, an insulating layer 12 and a CNT 14 disposed on the insulating layer. The starting structure assumes that the CNT growth and placement has been achieved by any suitable technique known in the art, and that the substrate 10 with aligned and deposited nanostructures (e.g., CNTs) is available. In practice the can be a large number of CNTs 14 present. The ensuing description will focus on a process to fabricate a transistor device where a portion of the length of the CNT 14 functions as a channel that passes through a gate stack. It should be appreciated that in practice a number of transistor devices may be disposed in a serial fashion along the length of one CNT 14. It should also be appreciated that in practice a single transistor device can contain a plurality of CNTs 14 within the channel of the transistor.

The process flow described below beneficially provides source/drain (S/D) contacts that are self-aligned to the gate contact, and is compatible in every respect with a requirement to provide a high density layout.

In FIG. 1A the substrate 10 can be any suitable substrate, including a semiconductor substrate, a glass substrate, or a polymer-based substrate, that is compatible with the chemistries and temperatures used during the process flow. In the completed structure the substrate 10 is not electrically active. The insulating layer 12 can be any suitable electrically insulating material such as $SiO_2$. The CNT 14 can have a diameter in a range of, as non-limiting examples, about 0.5 nm to about 5 nm or greater, with a typical and suitable diameter being about 2 nm. The length of the CNT 14 can be any suitable value. In general a CNT can be characterized as having a length that greatly exceeds its width or diameter.

Figure 1B:
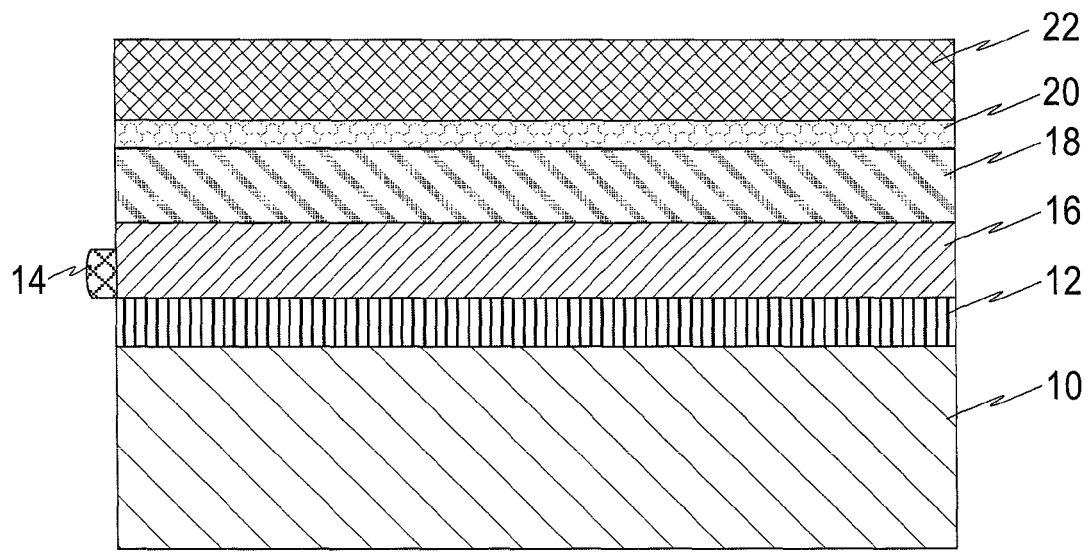

FIG. 1B shows the starting structure of FIG. 1A after the deposition of a non-damaging protective layer 16 over the CNT 14, followed by the deposition of a tri-layer resist stack composed of, for example, an organic planarization layer (OPL) 18, an oxide layer 20 and a resist layer 22. The non-damaging protective layer 16 can be formed by a spun-on-glass (SOG) process or by, for example, the atomic layer deposition (ALD) of $SiO_2$. In practice the thickness of the non-damaging protective layer 16 can be adjusted so that it completely embeds the CNT 14 with sufficient over-thickness to protect the CNT 14 during subsequent processing steps. The OPL 18 can be, for example, a resin applied by spin coating and baked to enhance structural integrity, or a liquid monomer applied by spin coating and hardened photochemically after an appropriate leveling period. In the practice of this invention any suitable OPL can be employed that is compatible with the ensuing processing steps. In general the OPL 18 is one that is preferably compatible with 400° C. processing, and the OPL 18 can have a thickness in a range of about 75 nm to about 400 nm or greater, with about 135 nm being a suitable value. The oxide layer 20 can have a thickness in a range of about 20 nm to about 35 nm and can be formed by a low temperature oxidation (LTO) process. The layer 20 can also be formed as a silicon-containing antireflection coating (SiARC). The resist layer 22 can have a thickness in a range of about 60 nm to several hundred nanometers, depending on the specifics of the photolithography process to be used during subsequent gate definition. In general the thickness of the resist layer 22 will be less than the thickness of the OPL 18.

Figure 1C:
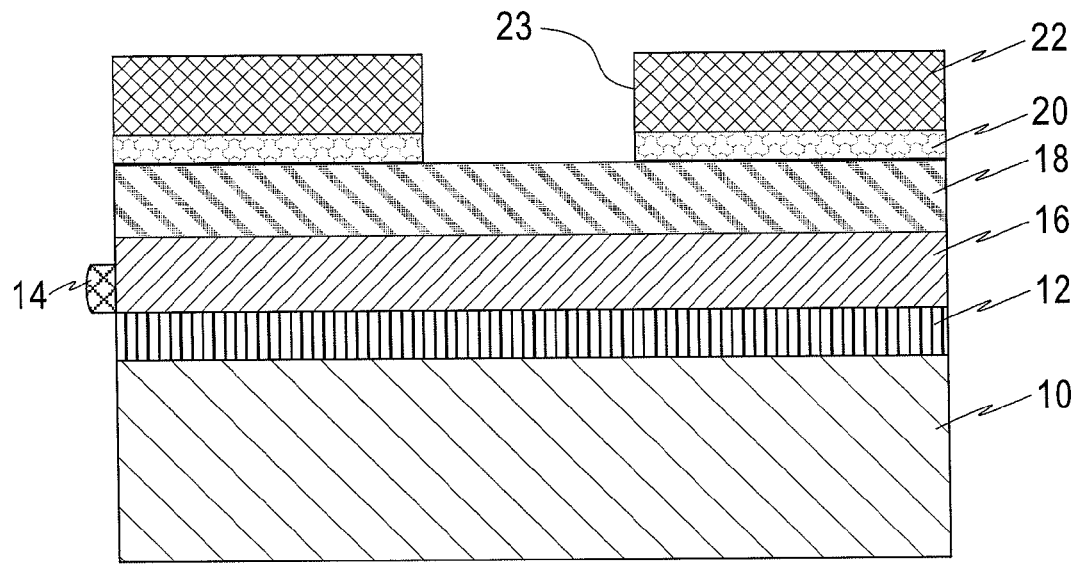

FIG. 1C shows the structure of FIG. 1B after patterning of the resist layer 22 using, for example, e-beam lithography or optical lithography to faun an opening 23 where the gate stack will be formed. After the opening 23 is formed in the resist layer 22 the underlying LTO or SiARC layer is patterned using a reactive ion etch (RIE) process that is selective to (i.e., stops on) the OPL 18. For example, a $CF_4/CHF_3$ RIE chemistry can be used. The resulting opening 23 through the resist layer 22 and the OPL or SiARC layer 20 can have a width in a range of, for example, about 5 nm to about 50 nm, or more preferably about 5 nm to about 20 nm. The width of the opening 23 defines the channel length of the transistor being fabricated.

Figure 1D:
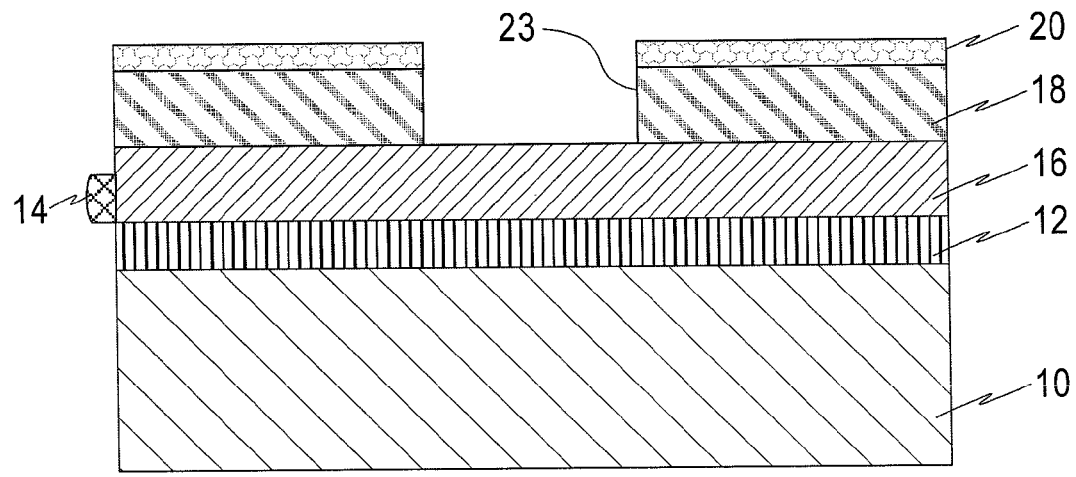

FIG. 1D shows the structure of FIG. 1C after patterning of the OPL 18 using RIE, where the resist layer 22 is removed during the patterning process. The RIE process is selective to (stops on) the $SiO_2$ layer 16 in which the CNT 14 is embedded. For example, a $CO_2/O_2$ RIE chemistry can be used.

Figure 1E:
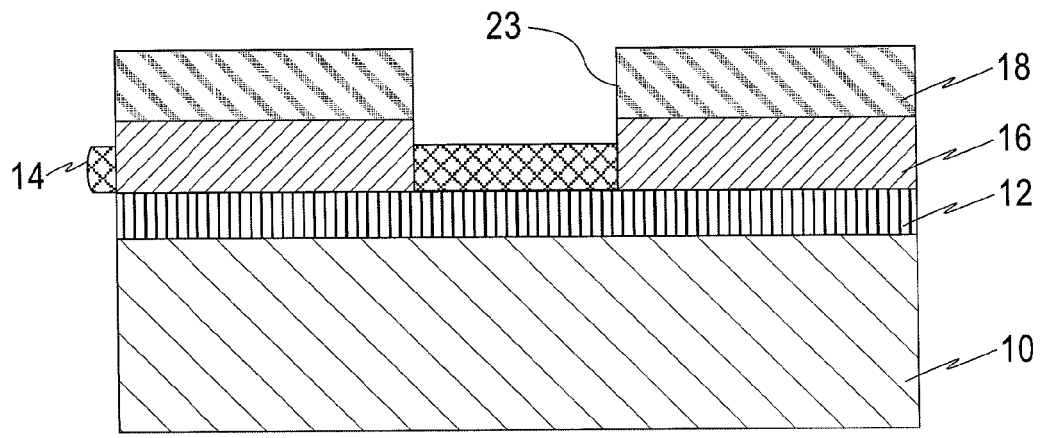
Figure 1E:
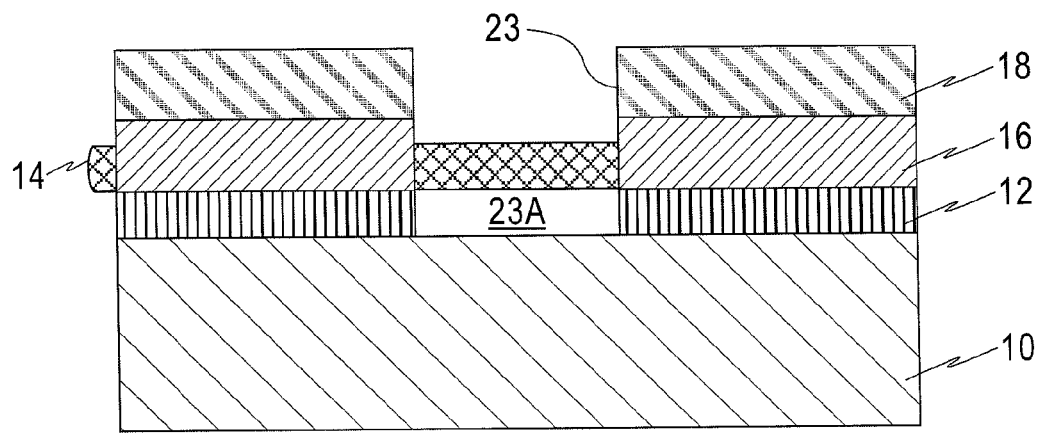

FIG. 1E shows the structure of FIG. 1D after a portion of the protective $SiO_2$ layer 16 is removed within the opening 23 using a dilute hydrofluoric acid (HF) solution etch to minimize isotropy. The result of the wet chemical etch is that the underlying portion of the CNT 14 is exposed. Note that the oxide layer 20 is also removed during the wet chemical etch. The wet chemical etch is preferred as the use of a dry etching process would have the potential to damage or degrade the CNT 14.

It can be noted that to achieve increased gate control and better electrostatics, a gate-all-around structure may be desired. To achieve a gate-all-around structure the insulator 12 can be selected such that it is also etched during the wet etch, or a separate wet etch may be used to remove portions of insulator 12 after insulator 16 is removed. The result is that the exposed portion of the CNT 14 is undercut and suspended above the surface of the substrate 10. Reference in this regard can be made to FIG. 1E' that shows an undercut region 23A beneath the suspended CNT 14.

Figure 1F:
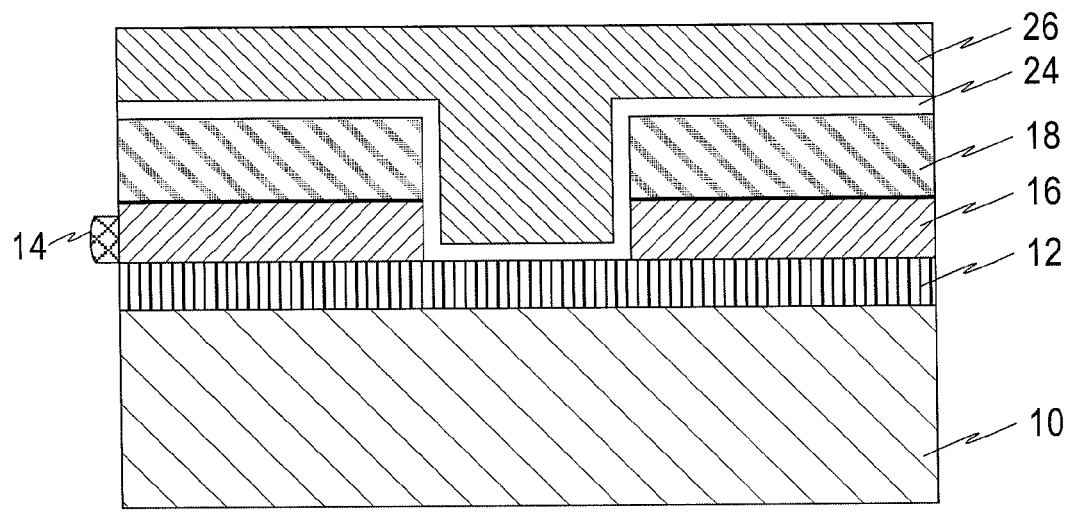

FIG. 1F shows the structure of FIG. 1E after gate stack deposition is performed. Preferably an ALD or a chemical vapor deposition (CVD) technique is used for the gate metallization step. If the CVD process is a plasma-enhanced CVD (PECVD) process then preferably $O_2$ is not present for the initial (gate dielectric) portion of the gate stack deposition, while if $O_2$ is present then a plasma-based process is avoided since the presence of free oxygen radicals can degrade or destroy the CNT 14 before it is passivated by another layer.

The gate stack metallization process proceeds by first blanket depositing a layer of gate dielectric 24 followed by a blanket deposition of desired gate metal (or metals) 26. The gate dielectric 24 can be any suitable dielectric material that will not be affected by subsequent processing steps. One suitable material is a high dielectric constant (high-k) material comprising a dielectric metal oxide having a dielectric constant that is greater than the dielectric constant of silicon nitride of 7.5. The high-k dielectric layer 24 may be formed by methods well known in the art including, for example, CVD and ALD. The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k dielectric layer 24 may be from about 1 nm to about 10 nm, and preferably from about 1.5 nm to about 3 nm. The gate metal layer 26 is deposited directly on the top surface of the high-k dielectric layer 24 and may be formed, for example, by chemical vapor deposition (CVD), physical vapor deposition (PVD), or atomic layer deposition (ALD). The material of the gate metal layer 26 may be, for example, a conductive transition metal nitride or a conductive transition metal carbide. Suitable materials include, but are not limited to, TiN, TiC, TaN, TaC, and a combination thereof. The gate metal layer 26 could also be composed of, as non-limiting examples, one or more of Au, Al, Pd and a Ni silicide.

At the completion of the processing steps shown in FIG. 1F the previously exposed portion of the CNT 14 (in FIG. 1E) is covered with the selected gate dielectric 24 that in turn is covered with the selected gate metal 26. This portion of the CNT 14 will function as the channel of the subsequently formed field effect transistor (FET).

For the embodiment of FIG. 1E' the entire circumference of the CNT 14 is coated with the selected gate dielectric 24 and is surrounded by the selected gate metal 26, thereby providing the gate-all-around type of transistor structure.

Figure 1G:
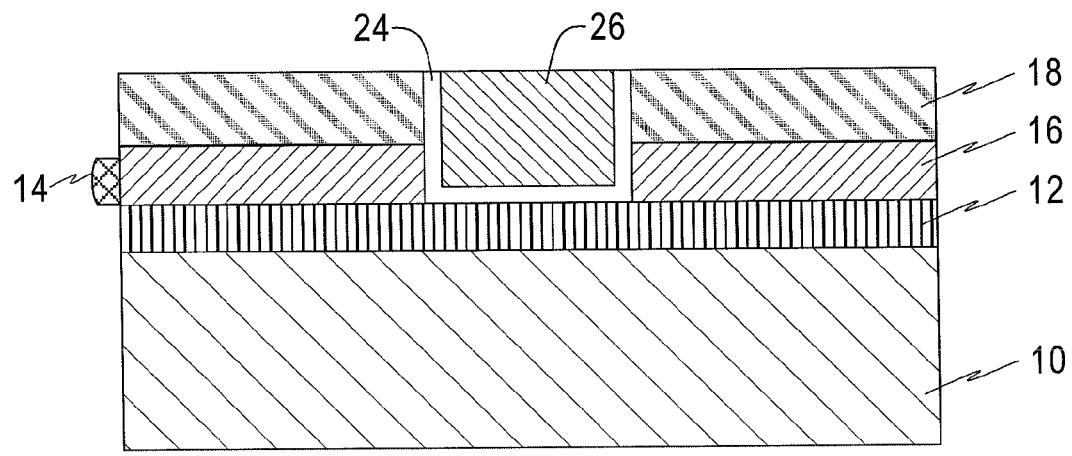

FIG. 1G shows the structure of FIG. 1F after a RIE or a chemical mechanical polish (CMP) is used to remove the metal and dielectric in the field, stopping on the OPL 18. The process step basically planarizes the structure formed thus far.

Figure 1H:
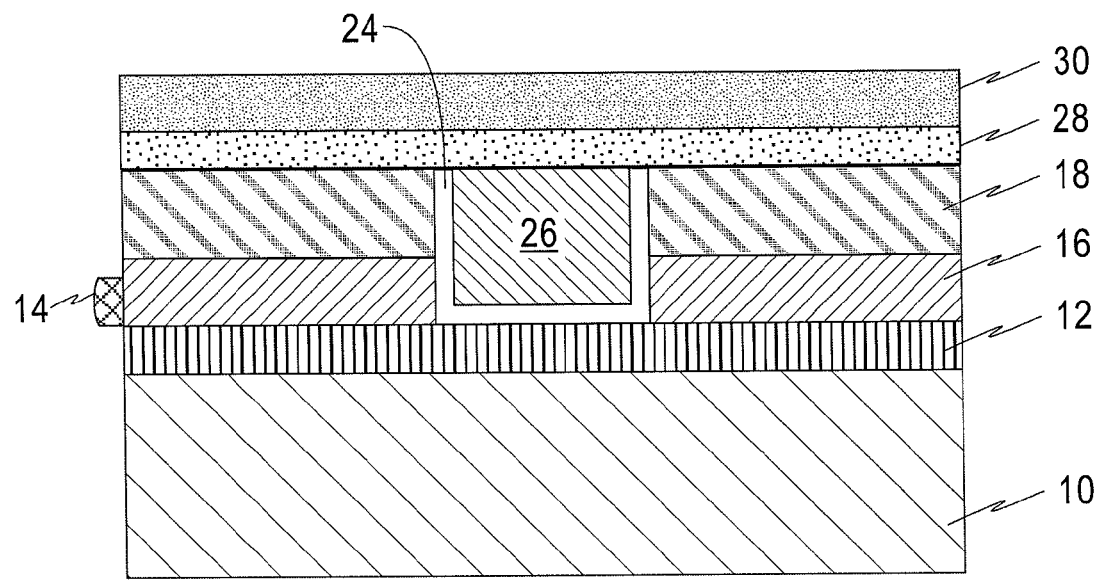

FIG. 1H shows the structure of FIG. 1G after a re-application of LTO or SiARC material to form layer 28 and a second layer 30 of resist is deposited.

Figure 1I:
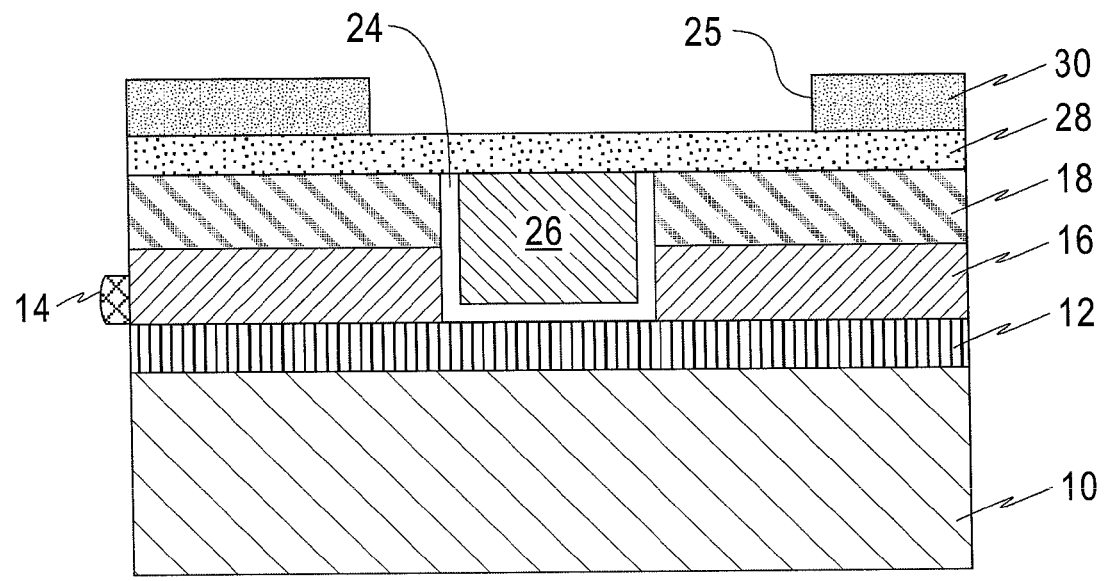

FIG. 1I shows the structure of FIG. 1H after a contact metal pattern is exposed as a shape that spans across the gate portion. An opening 25 is created by the selective removal of the resist layer 30. The width of the opening 25 is a function of the gate pitch (spacing between gates of adjacent devices). If a single device is being formed then the width may be about, for example, 50 nm.

Figure 1J:
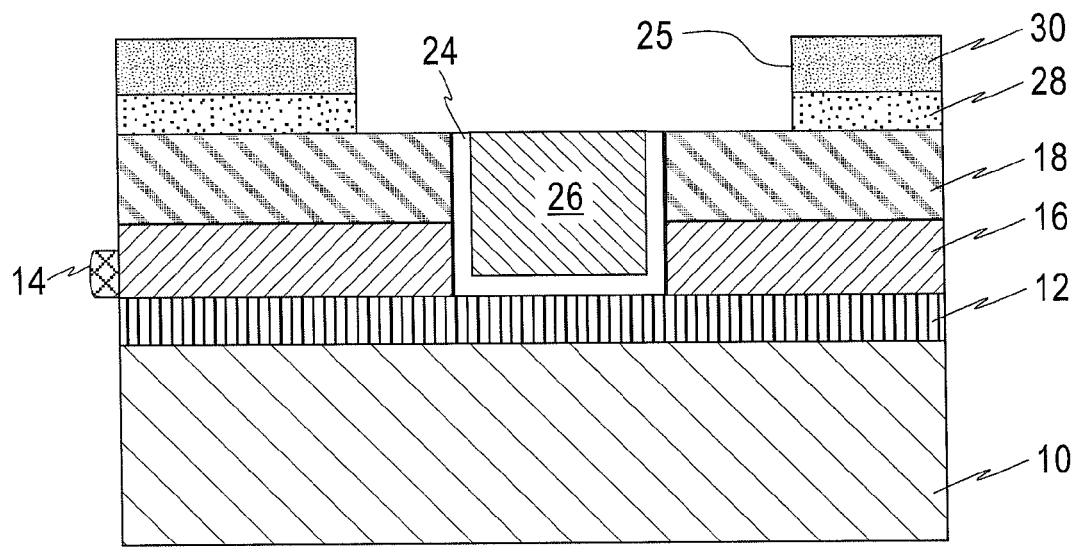

FIG. 1J shows the structure of FIG. 1I after the LTO or SiARC material of the layer 28 is removed using RIE that is selective to the gate materials and the OPL 18. Exemplary and non-limiting RIE processes to perform this process step include the use of a fluorinated gas plasma, such as one employing $CHF_3$ and $CF_4$-based chemistries. At this point the opening 25 has been extended to the top surface of the OPL 18.

Figure 1K:
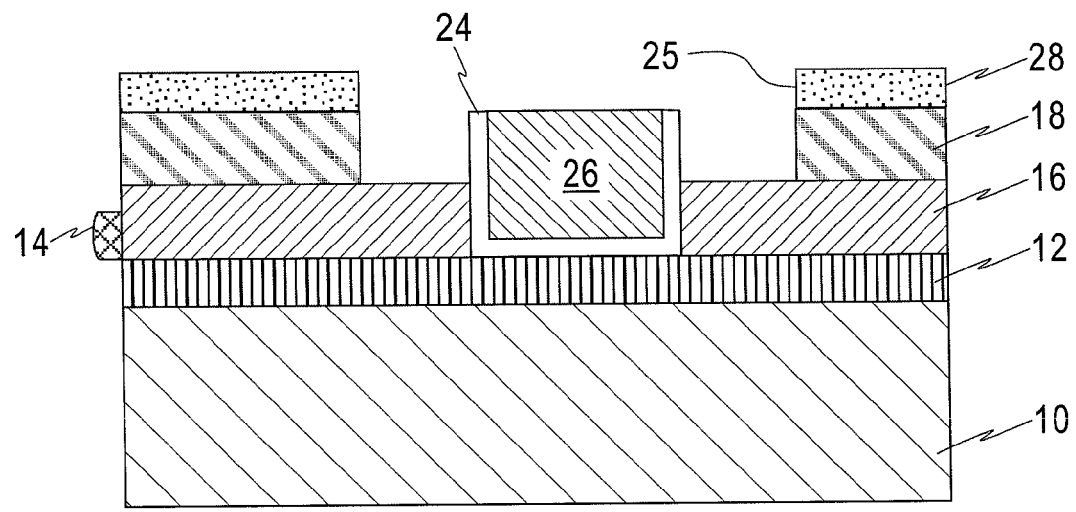

FIG. 1K shows the structure of FIG. 1J after the contact pattern is transferred into the OPL 18 using a RIE process that is selective to the gate stack. Exemplary RIE chemistries that are suitable for use during this processing step include $O_2$, $H_2$ and $NH_3$ based plasmas.

Figure 1L:
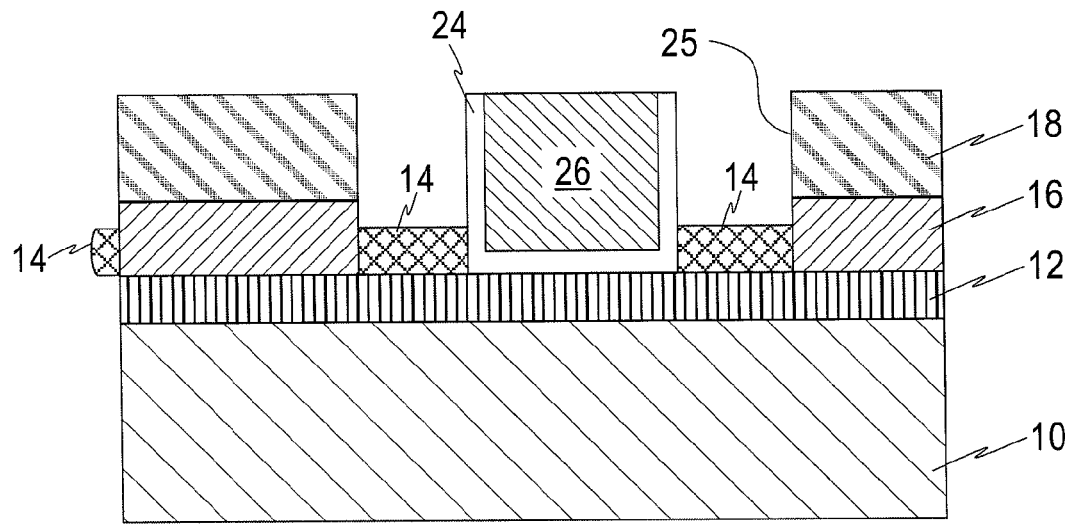

FIG. 1L shows the structure of FIG. 1K after the protective $SiO_2$ layer 16 is removed using a dilute HF solution within the opening 25 that defines the contact pattern. The high-k dielectric layer 24, metal gate electrode 26 and the OPL 18 materials are not affected by the HF etch. For better contact to the CNT 14 a wrap-around contact may be desired. To achieve a wrap-around contact, insulator 12 may be selected such that it is also etched during the wet etch, or a separate wet etch may be used to remove portions of insulator 12 after insulator 16 is removed. Note that the wrap-around contact may be used in conjunction with the wrap-around gate processing step shown in FIG. 1E', or it may be used without the wrap-around gate processing step shown in FIG. 1E'.

Figure 1M:
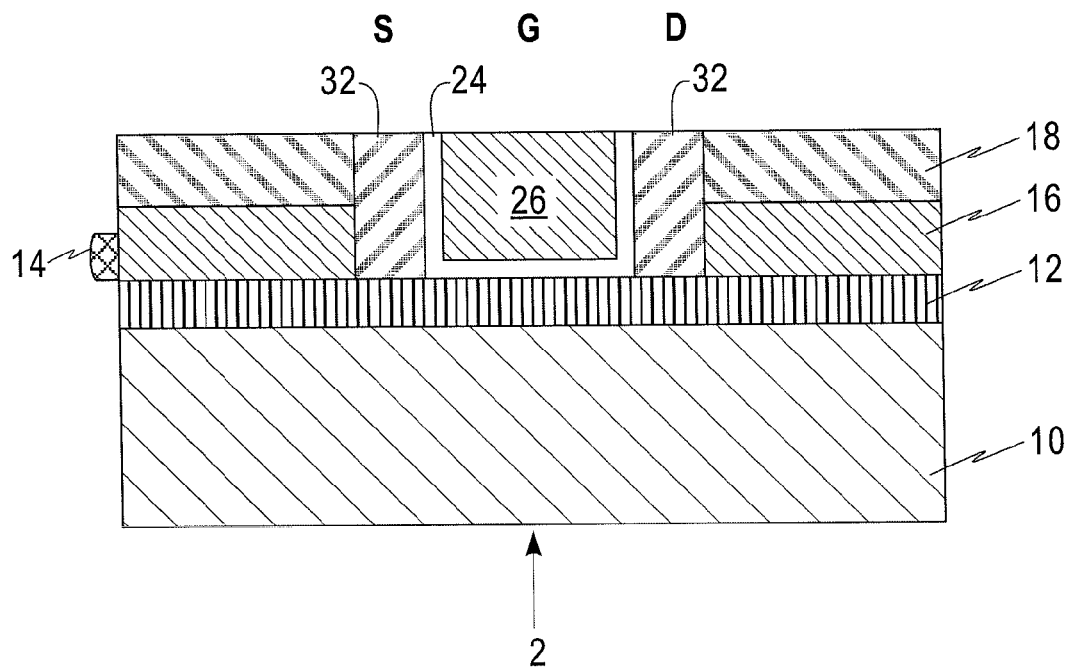

FIG. 1M shows the structure of FIG. 1L after the desired source (S) and drain (D) contact material 32 is deposited adjacent to the gate (G) stack using, for example, ALD or CVD processes and then subsequently etched back using RIE selective to the OPL 16. The contact metal 32 can be applied by a thermal evaporation process, or by a plating process if the contact metal is, for example, Cu. The contact metal that is used can depend on whether an nFET or a pFET is being formed. For an n-ET a lower work function (WF) metal system such as Ag or Al can be used, while for a pFET a higher WF metal system such as Au or Pd can be used. Those portions of the CNT 14 that are exposed during the processing step shown in FIG. 1L are over-coated with and electrically conductively coupled to the applied contact metal. 32.

Figure 2:
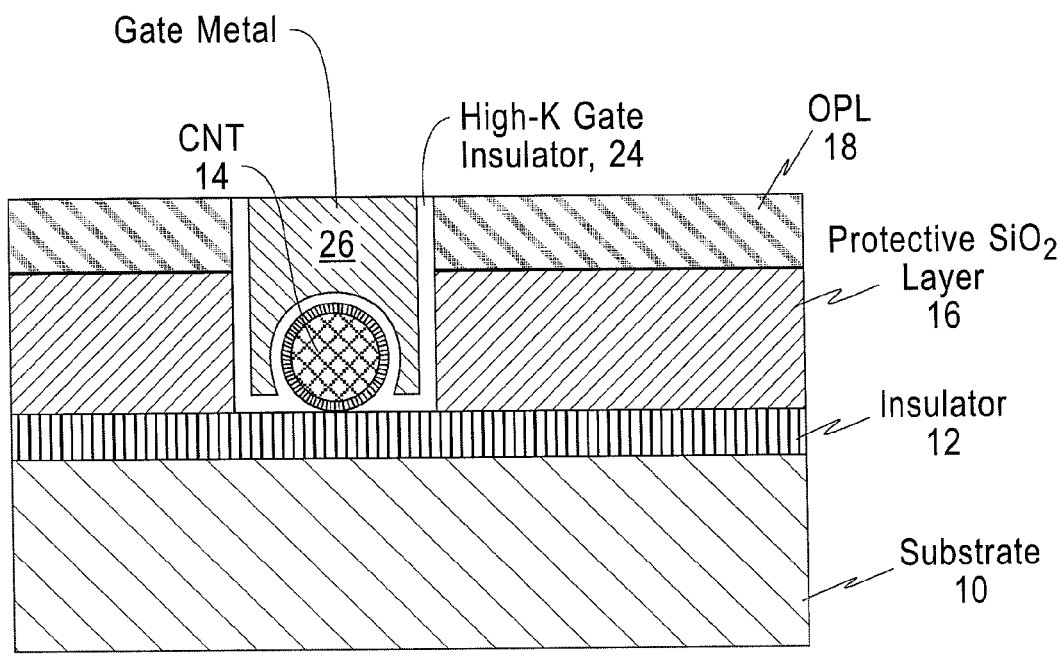
FIG. 2 is sectional view through the structure at the completion of the processing of FIG. 1M along a plane indicated as '2' in FIG. 1M, where the sectional view is taken through the gate stack.

FIG. 2 is an enlarged sectional view, also not drawn to scale, through the structure at the completion of the processing of FIG. 1M (along a plane indicated as '2' in FIG. 1M). The sectional view is taken through the gate stack and shows the CNT 14 supported by the insulator layer 12 and covered with gate insulator 24 (e.g., the high-k gate insulator material) beneath the gate metal 26. The gate stack and contact metal are embedded in the surrounding protective $SiO_2$ layer 16 and the OPL 18.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, feature dimensions, layer thicknesses, layer materials, etchants and etching processes, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent mathematical expressions may be used by those skilled in the art. However, all such and similar modifications of the teachings of this invention will still fall within the scope of this invention.

What is claimed is:

1. A structure, comprising:
   a substrate having a carbon nanotube disposed over a surface of the substrate, the carbon nanotube being partially disposed within a protective electrically insulating layer comprised of $SiO_2$;
   a gate stack disposed over the substrate, where a first portion of a length of the carbon nanotube not covered by the protective electrically insulating layer passes through the gate stack and where the first portion of the length defines a channel;
   a source contact disposed adjacent to a first side of the gate stack, where a second portion of the length of carbon nanotube not covered by the protective electrically insulating layer is conductively electrically coupled to the source contact; and
   a drain contact disposed adjacent to a second, opposite side of the gate stack, where a third portion of the length of carbon nanotube not covered by the protective electrically insulating layer is conductively electrically coupled to the drain contact,
   where said gate stack, said source contact and said drain contact are contained within the protective electrically insulating layer and within an electrically insulating organic planarization layer that is disposed over the protective electrically insulating layer, where
   the gate stack is comprised of a layer of gate insulator that is disposed upon the first portion of the length of the carbon nanotube and a layer of gate metal that is disposed upon the layer of gate insulator, where the layer of gate insulator is comprised of a high dielectric constant material, and where
   the layer of gate insulator material comprised of the high dielectric constant material is also disposed between and in contact with a sidewall of the drain contact and a first sidewall of the gate metal and between and in contact with a sidewall of the source contact and a second opposite sidewall of the gate metal.

2. The structure of claim 1, where there are a plurality of gate stacks and associated source and drain contacts disposed along the length of the carbon nanotube.

3. The structure of claim 1, where there is a plurality of carbon nanotubes each having the first portion of their respective lengths passing through the gate stack and defining the channel.

4. The structure of claim 1, further comprising an insulator layer disposed between the carbon nanotube and the surface of the substrate.

5. The structure of claim 1, where the source contact and the drain contact are each comprised of a metal having a work function selected for forming one of an nFET or a pFET.

6. The structure of claim 1, where said electrically insulating organic planarization layer is comprised of a resin having a thickness in a range of about 75 nm to about 400 nm.

7. A transistor device, comprising:
   a carbon nanotube disposed over a surface of a substrate, the carbon nanotube being partially disposed within a protective electrically insulating layer comprised of $SiO_2$;
   a gate stack disposed over the substrate, where a first portion of a length of the carbon nanotube not covered by the protective electrically insulating layer passes through the gate stack and where the first portion of the length defines a channel of the transistor device;
   a source contact disposed adjacent to a first side of the gate stack, where a second portion of the length of carbon nanotube not covered by the protective electrically insulating layer is conductively electrically coupled to the source contact; and
   a drain contact disposed adjacent to a second, opposite side of the gate stack, where a third portion of the length of carbon nanotube not covered by the protective electrically insulating layer is conductively electrically coupled to the drain contact,
   where said gate stack, said source contact and said drain contact are contained within the protective electrically insulating layer and within an electrically insulating organic planarization layer that is disposed over the protective electrically insulating layer, where
   the gate stack is comprised of a layer of gate insulator that is disposed upon the first portion of the length of the carbon nanotube and a layer of gate metal that is disposed upon the layer of gate insulator, where the layer of gate insulator is comprised of a high dielectric constant material, and where
   the layer of gate insulator material comprised of the high dielectric constant material is also disposed between and in contact with a sidewall of the drain contact and a first sidewall of the gate metal and between and in contact with a sidewall of the source contact and a second opposite sidewall of the gate metal.

8. The transistor device of claim 7, where there are a plurality of gate stacks and associated source and drain contacts disposed along the length of the carbon nanotube.

9. The transistor device of claim 7, where there are a plurality of carbon nanotubes each having the first portion of their respective lengths passing through the gate stack and defining the channel.

10. The transistor device of claim 7, further comprising an insulator layer disposed between the carbon nanotube and the surface of the substrate.

11. The transistor device of claim 7, where the transistor device is one of an nFET or a pFET and where the source contact and the drain contact are each comprised of a metal having a work function selected for forming one of the nFET or the pFET.

12. The structure of claim 1, where said source contact is self-aligned with the first side of said gate stack and where said drain contact is self-aligned with the second, opposite side of said gate stack.

13. The transistor device of claim 7, where said source contact is self-aligned with the first side of said gate stack and where said drain contact is self-aligned with the second, opposite side of said gate stack.

14. The structure of claim 1, where the first portion of the length of said carbon nanotube is coated with gate dielectric material and is surrounded with gate metal providing a gate-all-around type of structure.

15. The transistor device of claim 7, where the first portion of the length of said carbon nanotube is coated with gate dielectric material and is surrounded with gate metal providing a gate-all-around type of structure.

16. The transistor device of claim 7, where said electrically insulating organic planarization layer is comprised of a resin having a thickness in a range of about 75 nm to about 400 nm.

\* \* \* \* \*